United States Patent [19]
Christopher

[11] Patent Number: 5,392,230
[45] Date of Patent: Feb. 21, 1995

[54] FIR FILTER APPARATUS FOR MULTIPLEXED PROCESSING OF TIME DIVISION MULTIPLEXED SIGNALS

[75] Inventor: Lauren A. Christopher, Indianapolis, Ind.

[73] Assignee: Thomson Consumer Electronics, Indianapolis, Ind.

[21] Appl. No.: 276,690

[22] Filed: Jul. 18, 1994

Related U.S. Application Data

[63] Continuation of Ser. No. 921,790, Jul. 29, 1992, abandoned.

[51] Int. Cl.[6] .............................................. G06F 15/31
[52] U.S. Cl. ............................. 364/724.13; 364/724.16
[58] Field of Search ....................... 364/724.01, 724.10, 364/724.13, 724.16

[56] References Cited

U.S. PATENT DOCUMENTS

| | | | |
|---|---|---|---|
| 3,665,171 | 5/1972 | Morrow | 364/724.16 |
| 4,191,853 | 3/1980 | Piesinger | 364/724.13 |
| 4,323,980 | 4/1982 | Houdard et al. | 364/724.13 |
| 4,398,262 | 8/1983 | Williams | 364/724.13 |
| 4,502,074 | 2/1985 | Reitmeier | 358/23 |
| 4,514,760 | 4/1985 | Balaban et al. | 358/143 |
| 4,615,026 | 9/1986 | Schiff | 364/724.16 |

FOREIGN PATENT DOCUMENTS 0464666 1/1992 European Pat. Off.
2532130 8/1983 France.

OTHER PUBLICATIONS

Digital Communication by E. A. Lee & D. G. Messerschmitt, pp. 553–554, 1988, Kluwer Publishers, Boston, Mass., USA.

A VLSI Architecture For A High Speed All-Digital Quadrature Modulator And Demodulator For Digital Radio Applications, by Henry Samueli, IEEE Journal on Selected Areas in Communications, vol. 3. No. 8, Oct. 1990, pp. 1512–1519.

Finer Audio From CDs, Machine Design, Aug. 24, 1989, No. 17, pp. 64 & 66.

*Primary Examiner*—Roy N. Envall, Jr.
*Assistant Examiner*—Chuong D. Ngo
*Attorney, Agent, or Firm*—Joseph S. Tripoli; Eric P. Herrmann; Ronald H. Kurdyla

[57] ABSTRACT

Finite impulse response (FIR) filter circuitry for processing time division multiplexed sampled signals includes parallel sets of delay elements, for delaying respective signals to be filtered, each set having a plurality of taps. Corresponding taps of the respective sets of delay elements are coupled to common weighting and summing structure. A time division multiplexed signal is coupled to the parallel sets of delay elements, respective sets being exclusively clocked on the occurrence of corresponding signals.

9 Claims, 6 Drawing Sheets

FIR FILTER APPARATUS FOR MULTIPLEXED PROCESSING OF TIME DIVISION MULTIPLEXED SIGNALS

This is a continuation of application Ser. No. 07/921,790, filed Jul. 29, 1962, now abandoned.

This invention relates to apparatus for time multiplexed processing of frequency multiplexed quadrature amplitude modulated (QAM) signals.

BACKGROUND OF THE INVENTION

The invention will be described in the environment of an advanced definition television receiver (ADTV) of the type for processing HDTV signals proposed by the Advanced Television Research Consortium (ATRC), however it is to be understood that practice of the invention is not limited to such systems, but is applicable to other systems having harmonically related amplitude modulated carriers.

Figure 1:
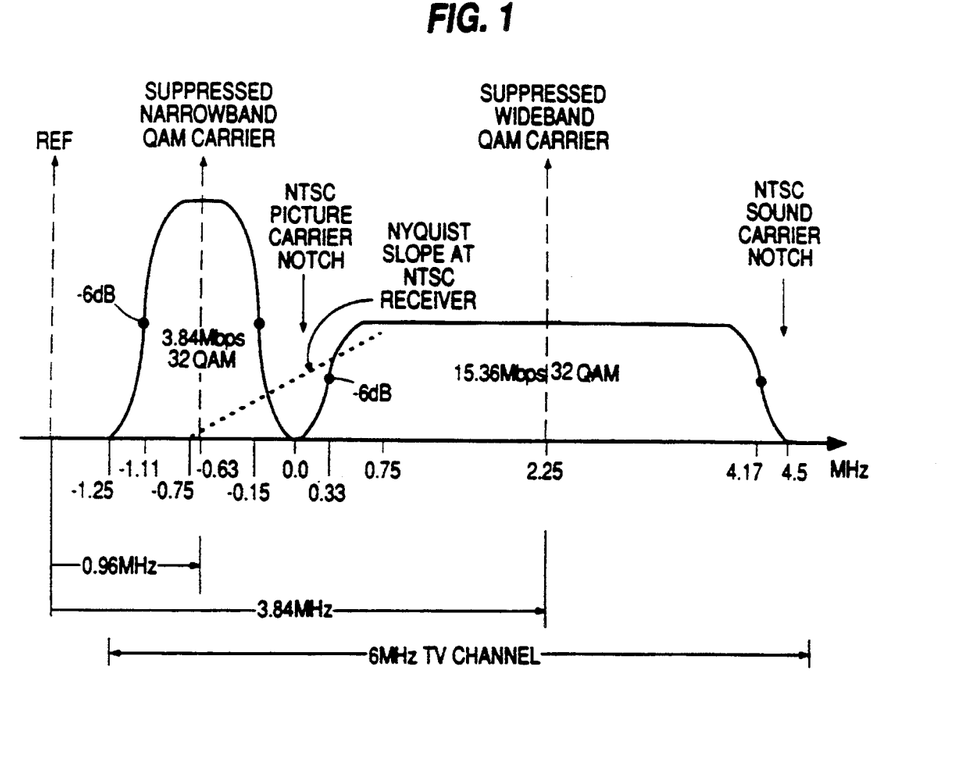
FIG. 1 is a graphical representation of the spectrum of an ADTV signal.

FIG. 1 illustrates a television signal in the ADTV system format. This signal is constrained to have a 6 MHz bandwidth in conformance with NTSC standards. Unlike NTSC television signal however, the ADTV signal consists of two quadrature amplitude modulated carriers, one of which is located in the lower one quarter of the 6 MHz channel space and the other which is located in the upper three quarters of the 6 MHz channel space. The upper carrier has a bandwidth which is four times as wide as the bandwidth of the lower carrier. The upper carrier frequency is exactly four times the lower carrier frequency (related to a predetermined reference). In the FIG. 1 example both carriers are modulated 16 QAM.

Figure 2:
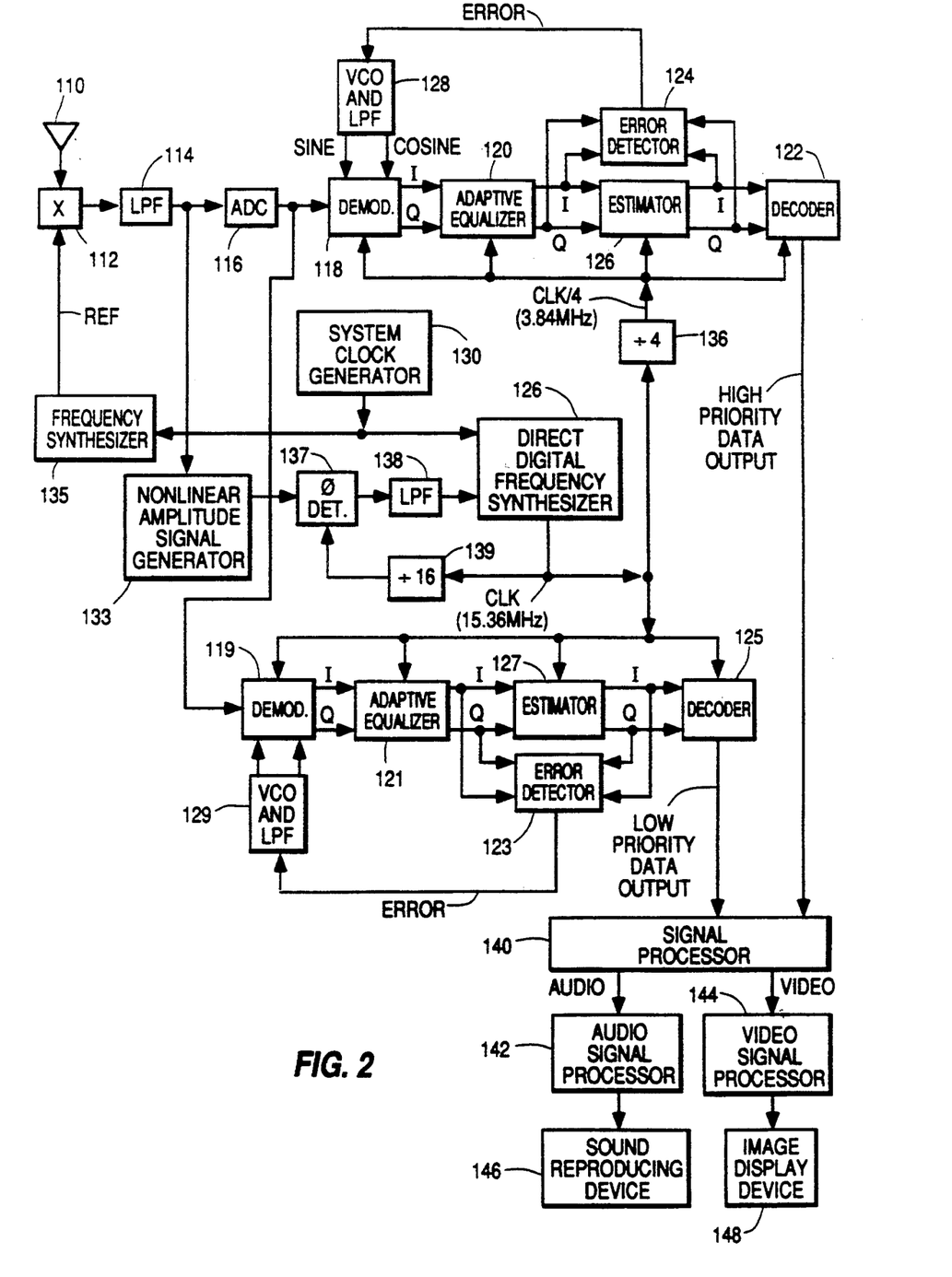
FIG. 2 is a block diagram of a portion of an ADTV receiver including the tuner and QAM demodulation circuitry.

FIG. 2 illustrates a portion of a typical ADTV receiver apparatus including the tuner IF and QAM demodulation circuitry. A detailed description of this apparatus will not be herein provided but may be found in U.S. Pat. No. 5,175,626. What is to be noted however, is the parallel processing circuitry (elements 118, 120, 122, 124, 126, 128, and elements 119, 121, 123, 125, 127, and 129) for processing the two QAM signals respectively. Each of these parallel processing paths consist of relative large and complex, and therefore expensive hardware. The present invention is directed toward reducing such parallel hardware, in order to make such a system affordable to the typical consumer. More particularly the invention is directed toward utilizing filters in time division multiplexed fashion to eliminate at least a portion of the parallel processing circuitry utilized to process frequency division multiplexed signals such as the two QAM signals illustrated in FIG. 1.

SUMMARY OF THE INVENTION

The present invention includes FIR filter circuitry for processing time division multiplexed sampled signals. The filter circuitry includes parallel sets of delay elements, for delaying respective signals to be filtered, each set having a plurality of taps. Corresponding taps of the respective sets of delay elements are coupled to common weighting and summing structure. Time division multiplexed signal is coupled to the parallel sets of delay elements, respective sets being exclusively clocked on the occurrence of corresponding signals.

DETAILED DESCRIPTION

Figure 3:
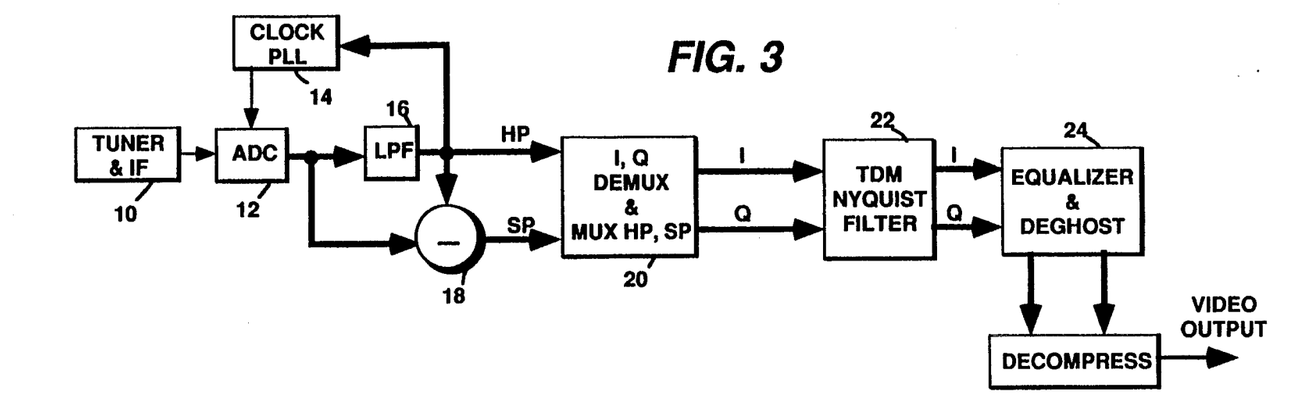
FIG. 3 is a block and QAM demodulation circuitry for processing plural QAM signals in a time division multiplexed embodying the present invention.

Refer to FIG. 3 which illustrates a portion of a more cost effective ADTV receiver. In FIG. 3, a broadcast signal having the spectral characteristics of the signal illustrated in FIG. 1 is applied to the tuner/IF circuitry 10. The local oscillator in the IF stage is selected to down convert the the center of the SP channel to the SP channel's symbol rate. The IF frequency is chosen to be 43.5 MHz, which places the center of the baseband SP channel at 3.84 MHz. The down converted ADTV signal is applied to an analog-to-digital converter (ADC) 12. The ADC 12 is clocked at a rate of four times the SP channel's symbol rate or 15.36 MHz. The sampling clock applied to the ADC (and the other system clocks) are generated in the clock element 14. Element 14 may include a VCXO incorporated in a phase locked loop for phase locking the system clocks and the sampling clock to one of the QAM carriers.

The 15.36 MHz samples generated by the ADC 12 are applied to a low pass filter 16, having a pass band to attenuate the wideband (SP) QAM carrier, and pass the narrower (HP) QAM carrier. The lowpass filtered HP samples are applied to the circuit element 20, and to the subtrahend input port of a subtracter 18. The 15.36 MHz ADTV samples from the ADC 12 are applied to the minuend input port of the subtracter 18. The differences passed by the subtracter represent the SP portion of the ADTV signal, that is the combination of the lowpass filter 16 and the subtracter 18 provides a high or bandpass filter function which attenuates that part of the spectrum occupied by the HP signal component. The SP signal component provided by the subtracter 18 is also applied to the circuit element 20.

Element 20 demodulates the respective HP and SP QAM signals into their respective in-phase (I) and quadrature-phase (Q) components. It also time division multiplexes the in-phase components of the SP an HP signals, and time division multiplexes the quadrature-phase components of the SP and HP signals. The symbol rate of the SP signal is exactly four times the symbol rate of the HP signal. In addition the ADTV signal was sampled at four times the SP symbol rate (16 times the HP symbol rate) and the sampling instants are phase locked to the SP carrier. Therefore, alternate samples of the SP signal correspond to in-phase and quadrature-phase signal components. The SP signal may be separated to its in-phase and quadrature-phase components merely by parsing alternate samples into an I signal path and a Q signal path. The in-phase and quadrature-phase components of the HP signal may be separated by selecting every fourth sample from the HP sample stream, and then parsing alternate ones of these samples into an I signal path and a Q signal path.

For every I (or Q) sample in the separated HP signal, there are four I (or Q) samples in the separated SP signal. The SP I or Q samples occur at a 7.68 MHz rate and the HP I or Q samples occur at a 1.92 MHz rate. Element 20 time division multiplexes the I (Q) component samples at in the ratio of four SP samples to one HP sample, and couples the multiplexed I (Q) samples to a Nyquist or symbol shaping filter 22.

Figure 7:
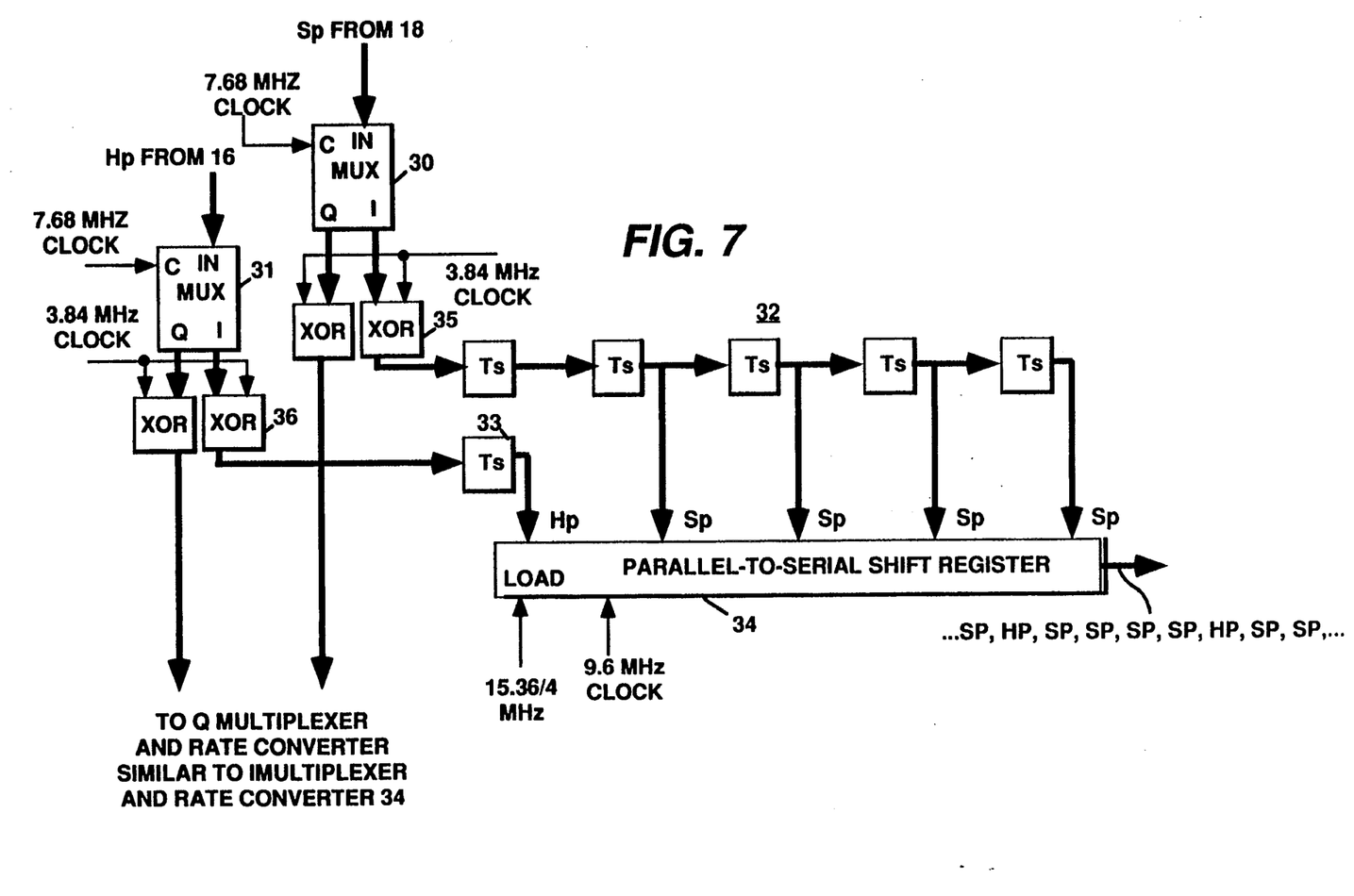
FIG. 7 is a block diagram of the I, Q DEMUX AND MUX element 20 of FIG. 3.

FIG. 7 illustrates exemplary circuitry for the element 20. In FIG. 7, the bandpass filtered SP signal from the subtracter 18 is applied to a one-to-two multiplexer 30, and the lowpass filtered HP signal is applied to the one-to-two multiplexer 31. Both the SP and HP signals occur at the 15.36 MHz rate. The control inputs C, of the respective multiplexers 30 and 31 are clocked at 7.68 MHz conditioning the multiplexers to couple alternate input samples to the I and Q output ports of the respective multiplexers, thus separating the I and Q components. Note, however, that even though the multiplexers 30 and 31 separate the I and Q components of the HP and SP signals, the I and Q signals are not demodulated as alternate samples correspond to 180 degree phases. Demodulation is performed by multiplying successive I samples and successive Q samples by 1, −1, 1, −1, 1, −1, 1, etc. This multiplication is performed by the exclusive OR gates XOR 35 and 36 which have first input ports coupled to receive the I and Q samples and second input ports coupled to a clock signal having a frequency of one half the output sample rate from the multiplexers.

Demodulation need not necessarily be performed at this point in the system. Whether it is or not affects the form of the succeeding filter functions. If demodulation is performed at this point, the following Nyquist filters will have lowpass transfer functions. Alternatively, if demodulation is performed after the Nyquist filters, then the Nyquist filters will have bandpass transfer functions.

The HP and SP in-phase components output from the respective multiplexers are at a 7.68 MHz rate. The SP I samples are coupled to a serial-input-parallel output shift register 32, which shifts samples at the 7.68 MHz rate. Successive output ports of the register 32 are coupled to the latter four input ports of a five-input parallel-input-serial-output shift register 34. The HP I samples are applied to a compensating delay stage 33 which shifts samples at the 7.68 MHz rate. Output samples from the stage 33 are applied to the fifth input port of the register 34. The load input of the register 34 is pulsed at a rate of 15.36/8 MHz to load a set of four successive SP and one HP I component samples. The register 34 is then clocked at 9.62 MHz to provide a serial stream of time division multiplexed SP and HP in-phase component samples. The quadrature-phase samples are separated and multiplexed in a similar manner with similar circuitry (not shown).

The demodulated and multiplexed I and Q samples, from element 20, are applied to square root Nyquist filters 22. The signal illustrated in FIG. 1 is transmitted with excess bandwidth, which bandwidth is tailored by Nyquist filters at the transmitter. In order to minimize signal noise at the receiver, the received signal is filtered with Nyquist filters having transfer functions substantially matched to the Nyquist filters incorporated at the transmitter. These filters are of the finite impulse response (FIR) type and typically have 30 or more taps and associated weighting circuits. Such filters are very hardware intensive. Arranging the filters to operate in time multiplexed fashion to process the time division multiplexed I and Q samples significantly reduces the required hardware.

Figure 4:
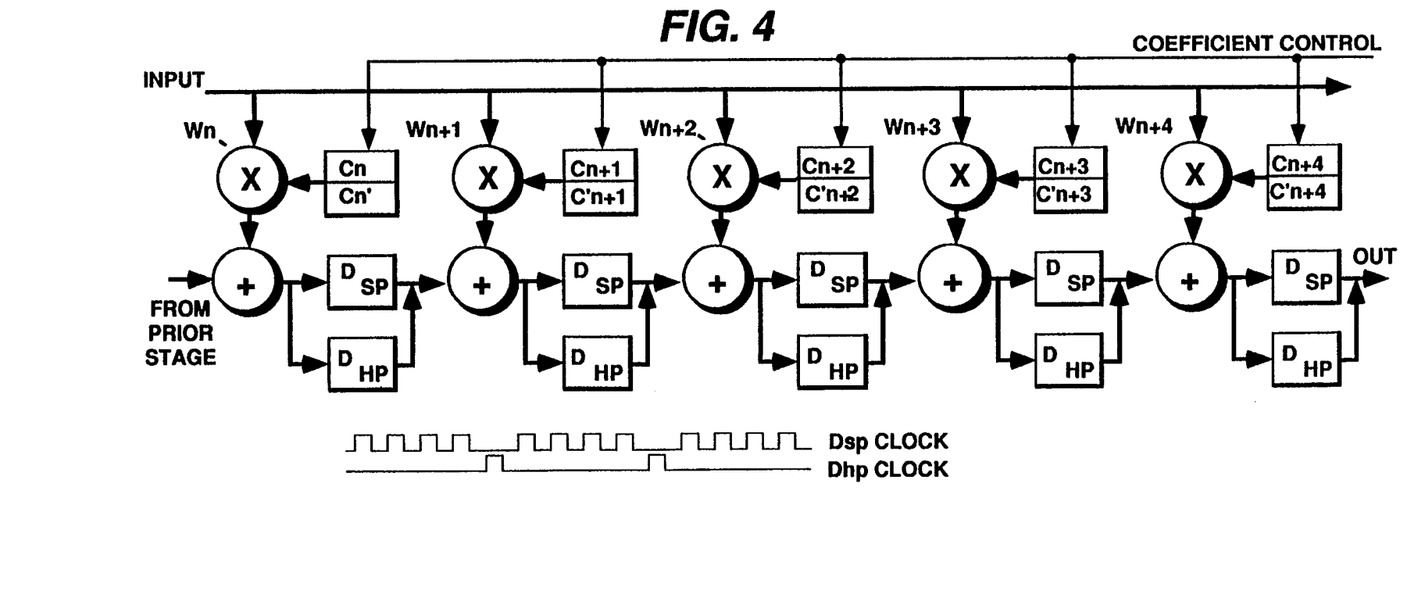
FIG. 4 is a block diagram of an input weighted FIR filter for the time division multiplexed filtering of two signals.

FIG. 4 illustrates in block form an example of a portion of one of the I and Q filters 22. The filter is arranged as an input weighted FIR filter. Assume that the time multiplexed I samples from the element 20 are applied to the bus designated INPUT. These samples are applied to each of the weighting circuits $W_{n+i}$ wherein they are weighted by respective coefficients $C_{n+i}$. The weighted samples from the respective weighting circuits are coupled to respective adders, which adders are interconnected by delay stages $D_{SP}$ ($D_{HP}$). The delay stages are clocked at the sample rate to successively process the applied samples, and provide a filtered signal at the output at the right end of the filter. Recall that the samples occur in the sequence SP, SP, SP, SP, HP, SP, SP, SP, SP, HP, etc. When an SP sample is applied to the input, the delay stages $D_{SP}$ are enabled or clocked, and when an HP sample is applied to the input the $D_{HP}$ delay stages are enabled or clocked. In this manner the SP (HP) samples are filtered independently of the HP (SP) samples. Each time a particular sample type SP (HP) is applied to the input, only those delay stages storing like type samples SP (HP) are interconnected between adder circuits forming a filter operative on only that type sample. That is, when SP (HP) samples are applied to the input, the $D_{HP}$ ($D_{SP}$) delay stages are effectively removed from the circuit (the information contained therein however is retained). The general timing of the two types of delay stages is shown in the FIGURE and labelled Dsp CLOCK and Dhp CLOCK for the sample sequence indicated above.

The system is illustrated with sources of weighting coefficients $C_{n+i}$ having two coefficients $C_{n+i}$ and $C'_{n+i}$, which applies to the general case for a time division multiplexed filter. In this instance the coefficients are switchable for the different types of samples, if desired. That is, the filter may be arranged to provide different transfer functions for the different signals by using alternate coefficients for the different signals. Thus, if the HP and SP signals are to be processed with different filter functions, for example, the set of coefficients $C_{n+i}$ ($C'_{n+i}$) will be applied to the weighting circuits $W_{n+i}$ when the HP (SP) samples are applied to the filter input. Switching of the coefficients is effected by the coefficient control signal (e.g., signal CB of FIG. 6).

Figure 5:
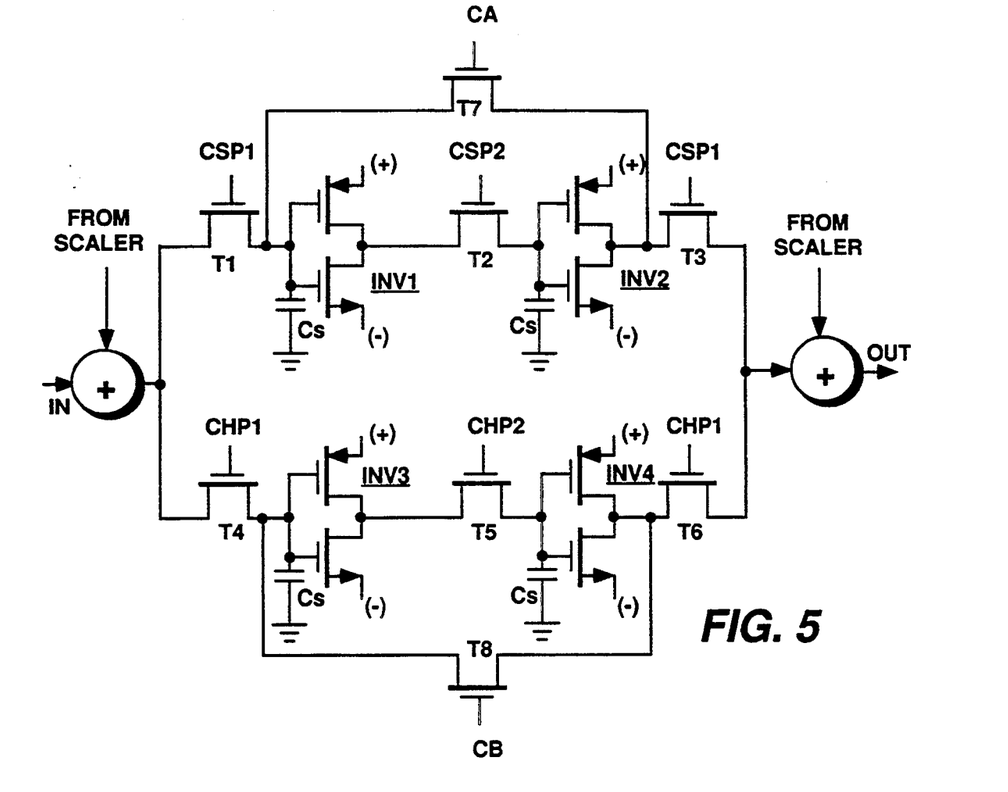
FIG. 5 is a schematic diagram of one stage of the filter of FIG. 4.
Figure 6:
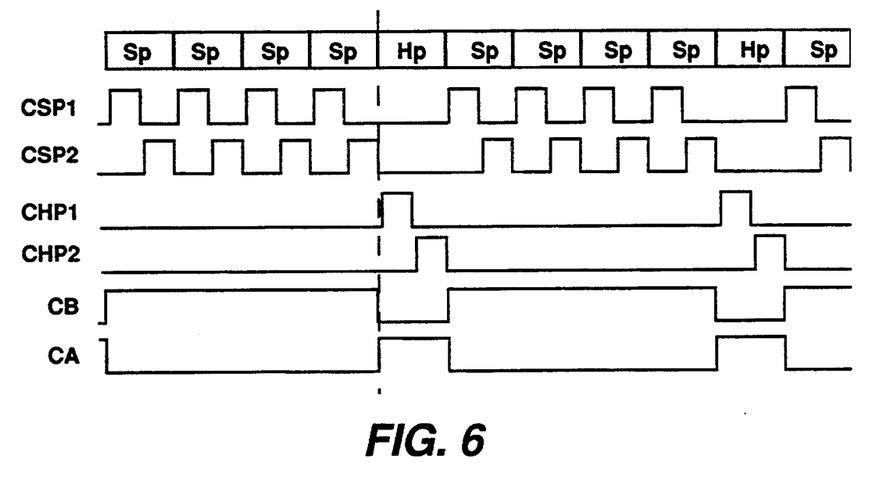
FIG. 6 is a timing diagram of respective clocking signals for operation of the circuitry of FIG. 5.

FIG. 5 illustrates in more detail exemplary circuitry which may be implemented for the delay stages $D_{SP}$ and $D_{HP}$. The circuitry shown is arranged to accommodate only one bit of the signal samples. In practice a number of such circuits, equal to the number of bits in the applied samples, will be arranged in parallel. Clock and/or control signal waveforms required to operate the FIG. 5 circuitry are illustrated in FIG. 6. In FIG. 6 the row of boxes designated SP, HP etc represent sample intervals and the respective sample type applied to the input of the filter during respective sample intervals.

In FIG. 5 the transistors T1, T2, T3, T7, and inverters INV1 and INV2 form the circuitry of one bit of the $D_{SP}$ delay stage, and the transistors T4, T5, T6, T8, and inverters INV3 and INV4 form the circuitry of one bit of the $D_{HP}$ delay stage. Clock signal CSP1 is applied to the transistors T1 and T3 to couple the SP signal samples to inverter INV1 from the preceding adder and to couple SP signal samples from inverter INV2 to the succeeding adder. The sample coupled to the inverter INV1 is stored on the stray capacitance Cs associated with the gate electrodes of the inverter INV1. The sample is retained on this gate capacitance when the transistor T1 is turned off. Antiphase clock CSP2 is applied to transistor T2 to condition T2 to couple the output of the inverter INV1 to the input of the inverter INV2. This occurs immediately after transistor T1 turns off. The sample value applied to the inverter INV2 is stored on the stray capacitance Cs associated with the gate electrodes of INV2. During the first half of a sample period n, INV2 is storing sample n-1 and provides sample n-1 to the output adder during the portion of sample period n that transistor T3 is conditioned to conduct by clock CSP1. Simultaneously sample n from the input adder is applied to the inverter INV1 via transistor T1. Transistors T1 and T3 are turned off at about the midpoint of sample period n with sample n being stored on the gate capacitance of INV1 and sample n-1 being output by INV2. During the second half of the sample interval n, transistor T2 is turned on, coupling the output potential of INV1 to the gate electrodes of INV2, at which time both the input to INV1 and the output of INV2 exhibit the same potential (corresponding to the state of sample n). Since the same potential occurs at the input of INV1 and the output of INV2, these points may be interconnected to retain the potential thereon indefinitely. However, in between successive sample periods it is not necessary to make such connection to retain the sample information, as the gate capacitances are sufficiently large to hold the values at the frequencies the samples occur. Transistor T7 is provided to make such connection, but in this example T7 is only conditioned to conduct during the sample periods that HP samples are applied to the filter. Note that when transistors T1 and T3 are conditioned to not conduct, the circuitry between transistors T1 and T3 is effectively removed from the system, however the data stored therein is not lost.

The circuitry of transistors T4 and T6 and the elements therebetween operate in a similar fashion except they are controlled by the clocks CHP1, CHP2 and CB, and as can be seen from FIG. 6 are arranged to operate when the opposite circuitry is idled.

Referring again to FIG. 3, the output of the Nyquist filter 22 is applied to an element 24 which may include an equalizer and/or a deghoster. These functions may be performed on the time division multiplexed signals from the filter 22. In an embodiment of this type, the equalizer and deghoster may be provided a reference basis corresponding to the time division multiplexed signal for generating appropriate coefficients for the correcting filters. Since such a deghoster and/or equalizer are trained with reference to a time multiplexed signal, they may take any of the known configurations. Alternatively, the HP and LP samples may be demultiplexed and applied to independent parallel equalizer and deghoster circuits, before being coupled to decompression circuitry.

Figure 8:
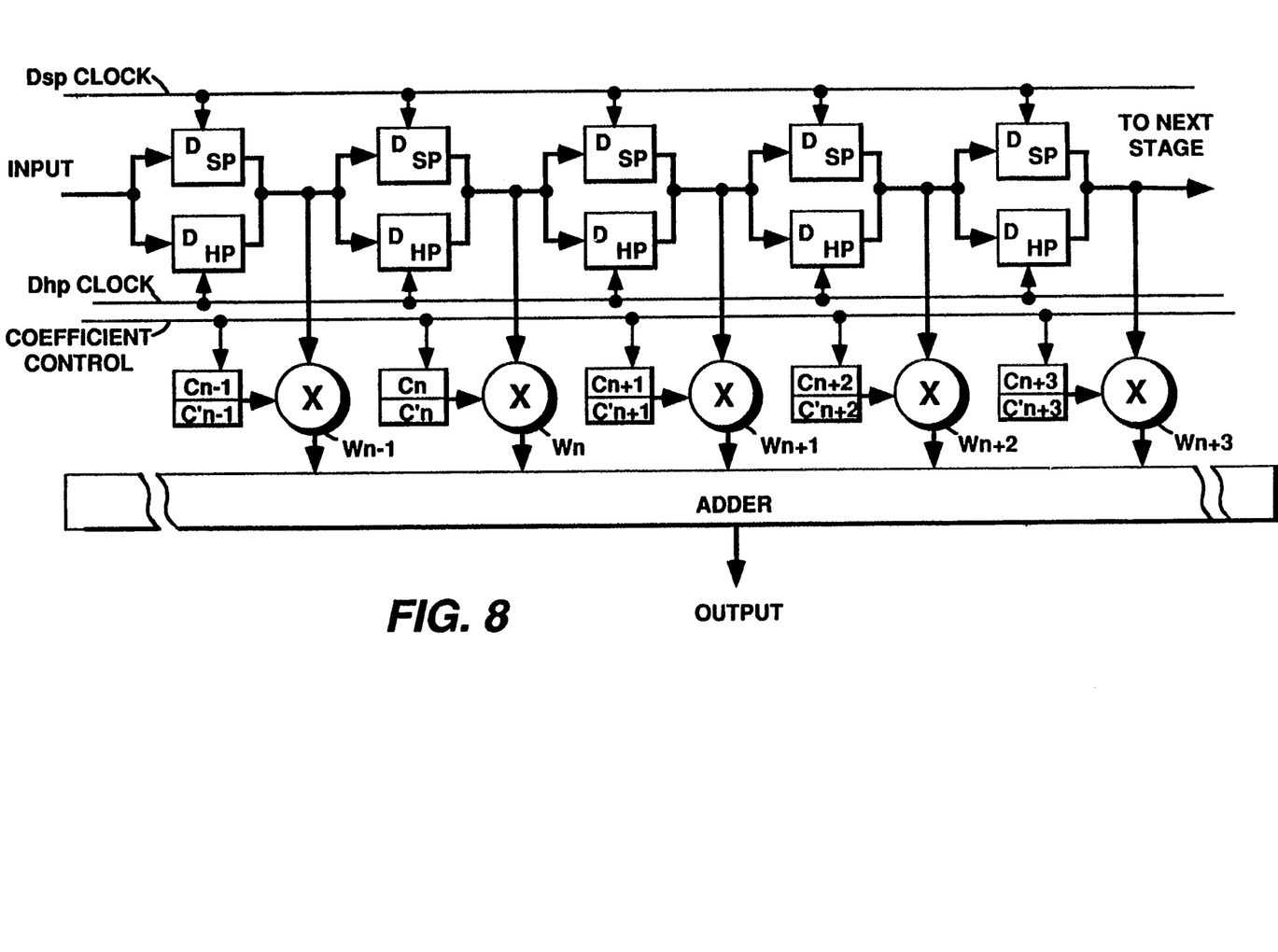
FIG. 8 is a block diagram of an output weighted FIR filter for the time division multiplexed filtering of two signals.

FIG. 8 illustrates an output weighted FIR filter for processing time division multiplexed signals. In FIG. 8 as in FIG. 4, the delay elements Dsp and Dhp are clocked or enabled to the exclusion of each other when the appropriate samples are applied to the input connection. The output will be a time division multiplexed signal wherein the individual components are independently filtered. As in the FIG. 4 arrangement provision is made to apply different coefficients to the weighting elements, if desired, for filtering the multiplexed signals according to different transfer functions.

FIGS. 4 and 8 show two sets of delay elements (Dsp, Hsp) for filtering two multiplexed signals. It will be readily apparent to those skilled in the art of circuit design that filters of this type may be arranged with M sets of paralleled delay elements for filtering M different multiplexed signals.

What is claimed is:

1. A time division multiplexed sampled data FIR filter including delay, weighting and combining means for generating a sampled data filtered signal in which respective samples are a weighted combination of a plurality of relatively delayed samples of an input signal, said sampled data FIR filter comprising:

a source of time division multiplexed sampled data input signal including samples representing at least two signals;

a plurality of weighting circuits;

combining means;

a plurality of delay circuits, each of said delay circuits comprising first and second delay means connected to each other in parallel respective said delay circuits coupled in cascade connection, and including means for inputting samples exclusively to said first or said second delay means and for providing delayed samples exclusively from said first or said second delay means;

means for connecting said plurality of weighting circuits, said combining means and said plurality of delay circuits in an input weighted FIR filter configuration, and coupling such FIR filter to said source; and means for conditioning said plurality of delay circuits to input samples to- and provide delayed samples from each of said first delay means on the occurrence of samples of a first of said at least two signals at said source, and to input samples to- and provide delayed samples from each of said second delay means on the occurrence of samples of a second of said at least two signals at said source.

2. The time division multiplexed sampled data FIR filter set forth in claim 1 wherein said weighting means includes means for weighting signal with a first set of weighting coefficients when samples are input to said first set of delay means and for weighting signal with a second set of weighting coefficients when samples are input to said second set of delay means.

3. The time division multiplexed sampled data FIR filter set forth in claim 1 wherein said combining means includes respective adder circuits, and the respective delay circuits are coupled in cascade by the adder circuits alternating with the delay circuits, said respective adder circuits having a first input port coupled to an output connection of a preceding delay circuit, an output connection coupled to an input port of a succeeding delay circuit and a second input port coupled to an output connection of one of said weighting circuits, and said weighting circuits having respective input ports coupled to said source.

4. The time division multiplexed sampled data FIR filter set forth in claim 1 wherein said time division multiplexed signal comprises two signals wherein every nth sample represents one of said two signals and the remaining samples represent the other of said two signals, and wherein said first and second delay means are clocked by respective clock signals, and the first and second delay means are clocked in a ratio of 1:(n-1), where n is an integer greater than 2.

5. A time division multiplexed sampled data FIR filter for filtering time division multiplexed signals occurring as samples of first and second signals in a ratio of 1: n where n is an integer greater than 1, said time division multiplexed sampled data FIR filter including delay, weighting and combining means for generating a sampled data filtered signal in which respective samples are a weighted combination of a plurality of relatively delayed samples of an input signal, said sampled data FIR filter comprising:

a source of time division multiplexed sampled data input signal including samples representing at least two signals;

a plurality of weighting circuits;

combining means;

a plurality of delay circuits, each of said delay circuits comprising first and second delay means connected to each other in parallel respective said delay circuits being coupled in cascade connection, and including means for inputting samples exclusively to said first or said second delay means and for providing delayed samples exclusively from said first or said second delay means;

means for connecting said plurality of weighting circuits, said combining means and said plurality of delay circuits in a FIR filter configuration, and coupling such FIR filter to said source; and means for conditioning said plurality of delay circuits to input samples to said first delay means on the occurrence of samples of a first of said at least two signals at said source, and to input samples to said second delay means on the occurrence of samples of a second of said at least two signals at said source.

6. A time division multiplexed sampled data FIR filter including delay, weighting and combining means for generating a sampled data filtered signal in which respective samples are a weighted combination of a plurality of relatively delayed samples of an input signal, said sampled data FIR filter comprising:

a source of time division multiplexed sampled data input signal including samples representing at least two signals occurring as samples in a ratio of 1: n where n is an integer greater than 1;

a plurality of weighting circuits;

combining means;

a plurality of delay circuits, each of said delay circuits comprising first and second delay means connected to each other in parallel said delay circuits being coupled in cascade connection, and including means for inputting samples exclusively to said first or said second delay means and for providing delayed samples exclusively from said first or said second delay means;

means for connecting said plurality of weighting circuits, said combining means and said plurality of delay circuits in an output weighted FIR filter configuration, and coupling such FIR filter to said source; and means for conditioning said plurality of delay circuits to input samples to said first delay means on the occurrence of samples of a first of said at least two signals at said source, and to input samples to said second delay means on the occurrence of samples of a second of said at least two signals at said source.

7. The time division multiplexed sampled data FIR filter set forth in claim 6 wherein said weighting means includes means for weighting signal with a first set of weighting coefficients when delayed samples are provided from said first set of delay means and for weighting signal with a second set of weighting coefficients when delayed samples are provided from said second set of delay means.

8. The time division multiplexed sampled data FIR filter set forth in claim 6 wherein respective said first delay means are coupled in cascade to form a first tapped delay line, respective said second delay means are coupled in cascade to form a second tapped delay line, and respective taps of said first and second delay lines are coupled to respective weighting and combining means.

9. The time division multiplexed sampled data FIR filter set forth in claim 6 wherein said time division multiplexed signal comprises two signals wherein every mth sample represents one of said two signals and the remaining samples represent the other of said two signals, and wherein said first and second delay means are clocked by respective clock signal, and the first and second delay means are clocked in a ratio of 1:(m-1), where m is an integer greater than 1.

* * * * *

UNITED STATES PATENT AND TRADEMARK OFFICE
CERTIFICATE OF CORRECTION

PATENT NO. : 5,392,230

DATED : February 21, 1995

INVENTOR(S) : Lauren A. Christopher

It is certified that error appears in the above-identified patent and that said Letters Patent is hereby corrected as shown below:

On the title page:

Item[56]  "References Cited" "U.S. PATENT DOCUMENTS" insert

--4,500,912  2/1985  Bolger............358/31--

Item[56]  "References Cited" "FOREIGN PATENT DOCUMENTS" insert

--2532130  2/1984  France.............H03H 17/00--

In the claims:
Column 6, line 27, after parallel insert --,--
Column 7, line 23, after parallel insert --,--
Column 8, line  7, after parallel insert --,--

Signed and Sealed this

Twenty-eighth Day of May, 1996

*Attest:*

BRUCE LEHMAN

*Attesting Officer*   *Commissioner of Patents and Trademarks*